United States Patent
Yamamoto

[11] Patent Number: 5,259,007
[45] Date of Patent: Nov. 2, 1993

[54] PHASE LOCKED LOOP FREQUENCY SYNTHESIZER

[75] Inventor: Tetsuo Yamamoto, Kanagawa, Japan

[73] Assignee: Sony Corporation, Tokyo, Japan

[21] Appl. No.: 899,416

[22] Filed: Jun. 16, 1992

[30] Foreign Application Priority Data

Jun. 19, 1991 [JP] Japan .................. 3-174623

[51] Int. Cl.$^5$ .............................. H03D 3/24
[52] U.S. Cl. ..................... 375/120; 333/1 A; 333/25
[58] Field of Search ............ 375/81, 97, 119, 120; 331/1 A, 18, 25, 51; 307/511, 514, 516, 526; 328/16, 55

[56] References Cited

U.S. PATENT DOCUMENTS

| | | | |
|---|---|---|---|
| 4,748,644 | 5/1988 | Silver | 375/120 |
| 5,052,031 | 9/1991 | Molloy | 333/1 A |
| 5,057,794 | 10/1991 | Shih | 375/120 |

FOREIGN PATENT DOCUMENTS 0388701  9/1990  European Pat. Off. ............ 375/120

Primary Examiner—Stephen Chin
Attorney, Agent, or Firm—Jerry A. Miller; Pasquale Musacchio

[57] ABSTRACT

A PLL Frequency Synthesizer includes a reference signal source which outputs a reference frequency signal. A phase of the signal out of the reference signal source and a phase of a signal coming back through a feed-back loop are compared by a phase comparator which detects the phase difference between them. The output of the comparator is integrated by a low pass filter which generates a voltage output corresponding to the phase difference. A voltage controlled oscillator is also provided to the PLL Frequency Synthesizer of the invention, an output frequency of which is controlled by the amplitude of a signal out of the low pass filter. The output signal out of the voltage controlled oscillator is divided by a variable divider whose denominator can be variable from outside. A frequency multiplier is provided between the phase comparator and the variable divider so as to multiply the frequency of signal derived from the variable divider.

4 Claims, 2 Drawing Sheets

PHASE LOCKED LOOP FREQUENCY SYNTHESIZER

BACKGROUND

1. Field of the Invention

The present invention relates generally to Phase Locked Loop (PLL) Frequency Synthesizers. In particular, the present invention relates to a PLL Frequency Synthesizer incorporated into a radio communication apparatus in use for mobile communication systems such as a digital cellular telephone apparatus.

2. Background of the Invention

Recently, mobile communication systems have become widely spread. A typical example is a cellular telephone system. However, the radio frequency band used for such mobile communication has a limited number of channels available for assignment. It is therefore necessary to utilize the bandwidth efficiently. In order to make better use of the available bandwidth some efforts have been made, for example, making a channel space in the band width narrower.

In a radio communication apparatus for mobile communication, a Phase-Locked Loop (PLL) Frequency Synthesizer is often used as a local oscillator. A highly pure and stable signal is required as an output of the PLL Frequency Synthesizer and, in addition, a short Lock-Up Time (the time needed for stabilizing the frequency fo the output signal when it is set to change) is required.

A PLL Frequency Synthesizer according to the present invention is shown in FIG. 5. In this PLL Frequency Synthesizer, assuming that a channel space is fc, the referenced oscillating frequency fr of the output from a reference signal source 21 could be set as follows.

$$fr = fc \quad (1)$$

Also, assuming that the divide ratio at the variable frequency divider 15 is N, the output frequency fo of a voltage controlled oscillator 14 could be set as follows.

$$fo = N \times fr \quad (2)$$

In the PLL Frequency Synthesizer in which the frequencies are preset as above, as the frequency band is made narrower for each of the radio channels within a certain frequency range, the frequency of the reference signal source 21 and the frequency of the output signal from a phase comparator 12 goes down. Therefore, low pass filter 13 requires a longer time constant to integrate an output of the phase comparator 12. This follows because it has to integrate a lower frequency signal. However, when the time constant is set longer, the Lock-Up Time characteristic of the PLL becomes worse, and therefore, it creates a problem.

SUMMARY OF THE INVENTION

It is, therefore, an object of the present invention to provide a PLL Frequency Synthesizer which is suitable for use as a frequency synthesizer for a radio communication apparatus.

It is another object of the present invention to provide a PLL Frequency Synthesizer with shortened Lock-Up Time.

It is also an object of the present invention to provide a PLL Frequency Synthesizer in which the time constant of its low pass filter can be made shorter.

It is further an object of the present invention to provide a PLL Frequency Synthesizer in which the output frequency of the phase comparator can be maintained at a higher frequency and not become too low.

In one aspect of the present invention, a PLL Frequency Synthesizer includes a reference signal source which outputs a reference frequency signal. A phase of the signal out of the reference signal source and a phase of a signal coming back through a feed-back loop are compared by a phase comparator which detects the phase difference between them. The output of the comparator is integrated by a low pass filter which generates a voltage output corresponding to the phase difference. A voltage controlled oscillator is also provided to the PLL Frequency Synthesizer of the invention, an output frequency of which is controlled by the level of a signal out of the low pass filter. The output signal out of the voltage controlled oscillator is divided by a variable divider whose denominator can be variable from outside A frequency multiplier is provided between the phase comparator and the variable divider so as to multiply the frequency of signal derived from the variable divider.

In another aspect of the invention, a PLL Frequency Synthesizer includes a frequency multiplier circuit which is made of a monolithic filter to select harmonics of the output of the variable divider.

In a further aspect of the invention, a PLL Frequency Synthesizer includes a frequency multiplier circuit which is made of a double balanced mixer to make the frequency twice that of a signal from the variable divider.

In accordance with the present invention, by means of the frequency multiplier circuit provided between the phase comparator and the frequency divider, the frequency of the output from the reference frequency source can be varied in accordance with multiplier. Therefore, it is possible to maintain the frequency of the output signal unchanged from the phase comparator even though the frequency of the output signal from the variable divider becomes low. It is also possible, by increasing the multiplier at the frequency multiplier circuit, to make the frequency of output signal from the phase comparator higher so that the time constant of low pass filter can be made shorter.

BRIEF DESCRIPTION OF THE DRAWING

The invention will be more readily understood with reference to the accompanying drawing, wherein.

DESCRIPTION OF THE INVENTION

Figure 1:
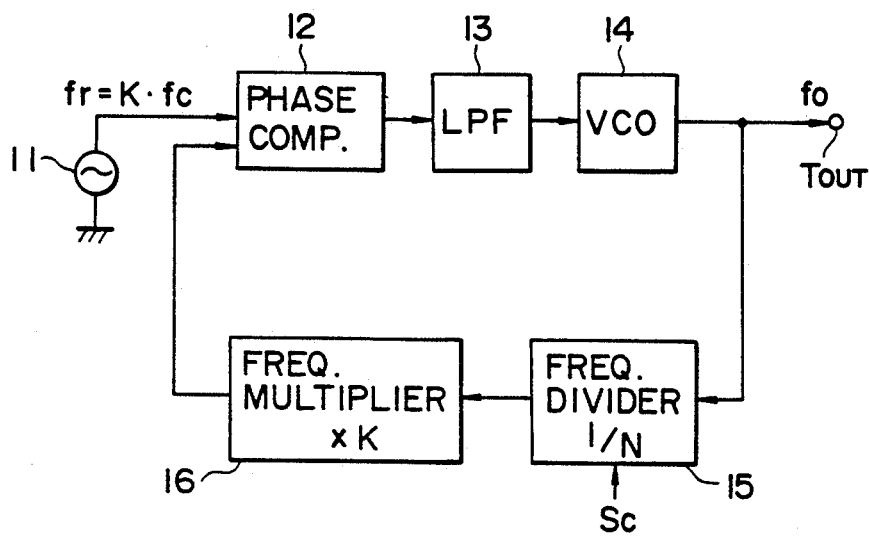
FIG. 1 shows a block diagram of a PLL Frequency Synthesizer as an embodiment of the invention.

Referring now to FIG. 1, a PLL Frequency Synthesizer is illustrated as an embodiment of the present invention, which includes a reference signal source 11, a phase comparator 12, a low pass filter 13, a voltage controlled oscillator 14, a variable frequency divider 15 and a frequency multiplier 16.

The reference signal source 11 provides as output a reference signal with a frequency fr. As described later in detail, the reference signal source 11 of this embodiment outputs a signal with the frequency a certain (K) times greater than a reference signal source 21 shown in FIG. 5. A phase comparator 12 is designed so that a phase of the output signal from the reference signal source 11 and a phase of the output from the frequency multiplier 16 can be compared to detect their phase differences. The signal showing the phase differences detected at the comparator 12 is then provided to a low pass filter to be integrated.

The low pass filter 13 produces a voltage signal in accordance with the phase differences between the outputs from the reference signal source 11 and the frequency multiplier 16. The voltage signal is supplied to the voltage controlled oscillator 14. The voltage controlled oscillator 14 controls the frequency of its output signal in accordance with the level of its input signal. The input voltage represents the phase difference. The output of voltage controlled oscillator 14 is supplied to an output terminal Tout as an output of this PLL Frequency Synthesizer and is also supplied to the variable frequency divider 15 located in a feedback loop. The variable frequency divider 15 can change its divide ratio according to a control signal Sc provided to an external input. Therefore, the output from voltage controlled oscillator 14 is divided by a certain number (N) at the variable frequency divider 15 and then provided to the frequency multiplier 16. As clarified above, the PLL Frequency Synthesizer of this embodiment includes the frequency multiplier 16 located between the variable frequency divider 15 and the phase comparator 12 shown in FIG. 5.

The operation by the PLL Frequency Synthesizer of this embodiment, used as a local oscillator in a radio communication apparatus with a radio channel space fc, is as follows. In this case, the divide ratio at the variable divider 15 is represented as N. The multiplication factor is represented by K. The reference oscillating frequency fr out of the reference signal source 11 is as follows.

$$fr = K \times fc \quad (3)$$

The frequency fo of the output signal from the voltage controlled oscillator 14 is as follows, if operated under the above mentioned preset conditions.

$$fo = N \times fc \quad (4)$$

Figure 5:
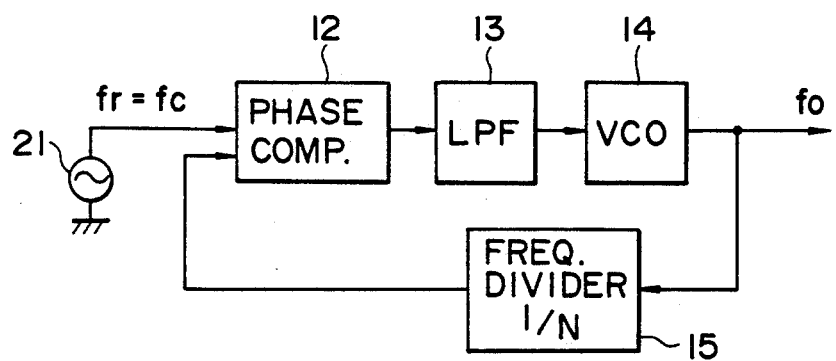
FIG. 5 shows a block diagram of a conventional PLL Frequency Synthesizer without a frequency multiplier circuit.

The embodiment can perform the same functions as the conventional PLL Frequency Synthesizer in FIG. 5. The only difference from the conventional circuit is the reference oscillating frequency fr output from the reference signal source 11. In other words, the output frequency of the phase comparator 12 becomes K × fc as shown in the form (3).

If the coefficient K is equal to 1 (K=1), the PLL Frequency Synthesizer of the present embodiment is completely equivalent to a conventional PLL Frequency Synthesizer. When the radio channel space of this embodiment becomes narrower the frequency fo becomes one half (½), the frequency of output from the phase comparator 12 can be kept unchanged by setting the coefficient K equal to two (K=2). Therefore, it is not necessary to change the time constant of the low pass filter 13, unlike the conventional example shown in FIG. 5. In other words, though the radio channel band becomes narrower, the lock-up time does not become longer in this embodiment of the invention.

Figure 2:
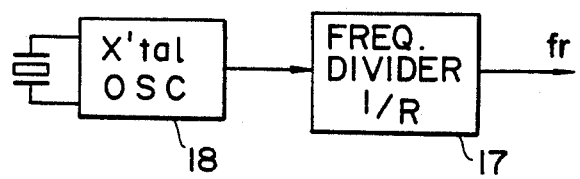
FIG. 2 shows an example of a reference signal source of the present invention.

Furthermore, if the value of coefficient K of the frequency multiplier 16 is increased further, the output frequency of the phase comparator 12 could be made higher. Therefore, gain in the PLL is increased and the lock-up time of the PLL can be shortened. In general, the reference signal of the PLL Frequency Synthesizer is generated by dividing an output signal from a crystal oscillator 18 at a variable frequency divider 17, as shown in FIG. 2. Therefore, the frequency fr of output signal from the reference signal source 11 can be easily set to fr=K × fc as the form (3) by appropriately selecting an oscillating frequency of the crystal oscillator 18 and the divide ratio of variable frequency divider 17.

Figure 3:
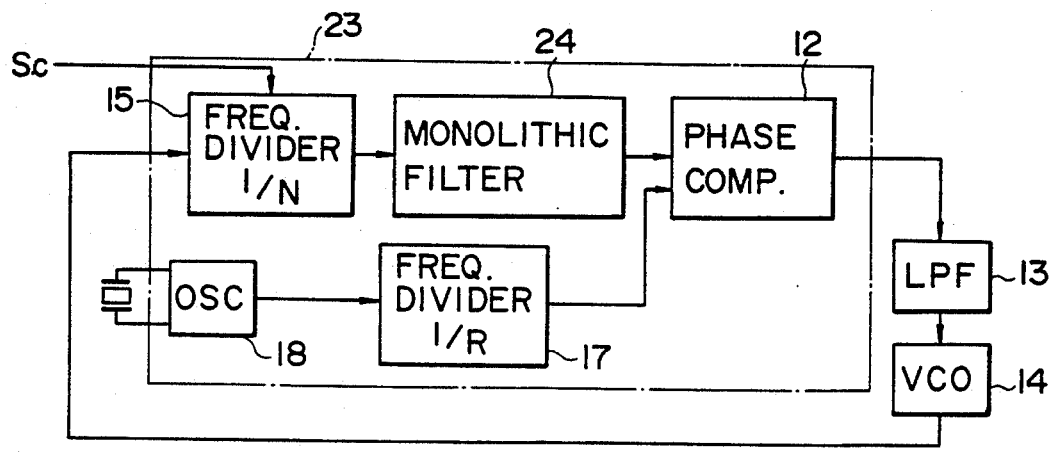
FIG. 3 shows a block diagram of a PLL Frequency Synthesizer made of a monolithic integrated circuit with a monolithic filter as another embodiment of the present invention.

Referring now to FIG. 3, another embodiment of the invention is illustrated, in which the PLL Frequency Synthesizer of the present invention is realized by a monolithic integrated circuit (IC) 23. In this embodiment, the frequency multiplier is realized by retrieving harmonics from the output of the variable frequency divider 15 using a monolithic filter (a band pass filter).

Figure 4:
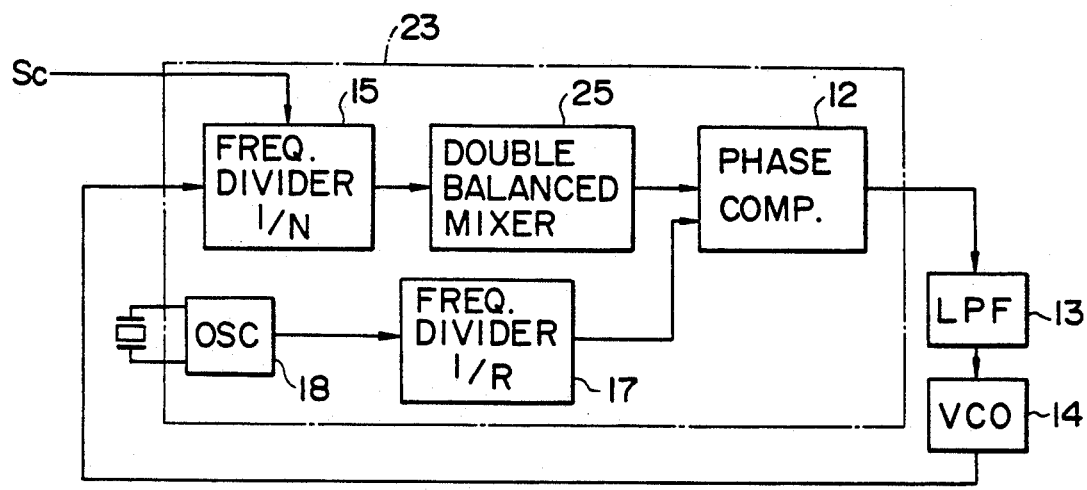
FIG. 4 shows a block diagram of a PLL Frequency Synthesizer made of a monolithic integrated circuit with a double balanced mixer as a further embodiment of the invention.

Referring further to FIG. 4, another modified embodiment of the invention is illustrated, in which the PLL Frequency Synthesizer of the present invention is realized also by a monolithic IC 23. In this modified embodiment, the frequency multiplier is realized by retrieving a doubled frequency signal by means of a double balanced mixer 25. The output of variable frequency divider 15 is provided to this double balanced mixer 25.

While specific embodiments of the invention have been shown and disclosed, it is to be understood that numerous changes and modifications may be made by those skilled in the art without departing from the scope and intent of the invention.

What is claimed is:

1. A Phase Locked Loop (PLL) Frequency Synthesizer comprising:
   a reference signal source for producing a referenced frequency signal,
   a phase comparator for comparing a phase of a signal from said reference signal source with a phase of a signal from a feed-back loop and producing an output indicative of a phase difference between said phases,
   a low pass filter for integrating said output of said comparator to generate a filter output with a voltage corresponding to said phase difference,
   a voltage controlled oscillator to generate an oscillator output with a frequency controlled by said filter output,
   first variable frequency dividing means for dividing a frequency of said oscillator output by a predetermined divide ratio, and
   a frequency multiplier connected between said phase comparator and said variable frequency dividing means to multiply the frequency of the signal derived from said variable frequency dividing means.

2. A PLL Frequency Synthesizer according to claim 1, wherein said frequency multiplier includes a monolithic filter to select harmonics of the output of said variable frequency divider.

3. A PLL Frequency Synthesizer according to claim 1, wherein said frequency multiplier includes a double balanced mixer to double the frequency of a signal from said variable frequency dividing means.

4. A PLL Frequency Synthesizer according to claim 1, wherein said reference signal source includes a crystal oscillator and a second variable frequency dividing means.

* * * * *